(12) United States Patent
Wu

(10) Patent No.: US 11,514,304 B2
(45) Date of Patent: Nov. 29, 2022

(54) CONTINUOUSLY PROVISIONING LARGE-SCALE MACHINE LEARNING MODELS

(71) Applicant: SAMSUNG SDS AMERICA, INC., Ridgefield Park, NJ (US)

(72) Inventor: Jian Wu, Sunnyvale, CA (US)

(73) Assignee: SAMSUNG SDS AMERICA, INC., Ridgefield Park, NJ (US)

( * ) Notice: Subject to any disclaimer, the term of this patent is extended or adjusted under 35 U.S.C. 154(b) by 1483 days.

(21) Appl. No.: 15/606,203

(22) Filed: May 26, 2017

(65) Prior Publication Data

US 2017/0344910 A1 Nov. 30, 2017

Related U.S. Application Data

(60) Provisional application No. 62/341,895, filed on May 26, 2016.

(51) Int. Cl.

| G06N 3/08 | (2006.01) |
|---|---|
| G06N 20/00 | (2019.01) |
| G06F 8/71 | (2018.01) |
| G06F 30/20 | (2020.01) |
| G06N 5/00 | (2006.01) |

(52) U.S. Cl.
CPC .............. *G06N 3/08* (2013.01); *G06F 8/71* (2013.01); *G06F 30/20* (2020.01); *G06N 20/00* (2019.01); *G06N 5/003* (2013.01)

(58) Field of Classification Search
CPC .......... G06N 20/00; G06N 3/04; G06N 5/027; G06N 20/20; G06N 3/08; G06N 5/022; G06N 5/04; G06N 7/005; G06N 3/0427; G06N 3/063; G06N 3/10; G06N 5/003; G06N 5/043; G06N 99/00
See application file for complete search history.

(56) References Cited

U.S. PATENT DOCUMENTS

| 8,990,149 B2 * | 3/2015 | Danciu | G06Q 10/06 |
| | | | 703/2 |
| 2015/0379430 A1 * | 12/2015 | Dirac | G06N 20/00 |
| | | | 706/12 |

OTHER PUBLICATIONS

Hicks et al., Dynamic Software Updating, 2001, PLDI 2001, pp. 13-23 (Year: 2001).*

(Continued)

*Primary Examiner* — Ann J Lo
*Assistant Examiner* — Charles C Kuo
(74) *Attorney, Agent, or Firm* — Sughrue Mion, PLLC

(57) ABSTRACT

An approach for continuously provisioning machine learning models, executed by one or more computer nodes to provide a future prediction in response to a request from one or more client devices, is provided. The approach generates, by the one or more computer nodes, a machine learning model. The approach determines, by the one or more computer nodes, whether the machine learning model is a new model. In response to determining the machine learning model is not the new model, the approach retrieves, by the one or more computer nodes, one or more model containers with an associated model to a new persistent model. The approach determines, by the one or more computer nodes, a difference between the associated model and the new persistent model. Further, in response to determining the machine learning model is the new model, the approach generates, by the one or more computer nodes, one or more model containers.

13 Claims, 3 Drawing Sheets

(56) References Cited

OTHER PUBLICATIONS

Kuncheva, Ludmila, Classifier Ensemble for Changing Environments, 2004 (Year: 2004).*

* cited by examiner

CONTINUOUSLY PROVISIONING LARGE-SCALE MACHINE LEARNING MODELS

CROSS-REFERENCE TO RELATED APPLICATION

This application claims priority under 35 U.S.C. § 120 to U.S. Provisional Application No. 62/341,895, filed on May 26, 2016, the disclosure of which is incorporated herein by reference in its entirety.

BACKGROUND

This disclosure relates generally to machine learning applications, and more particularly, to continuously provisioning large-scale machine learning models through model containers.

Complex machine learning applications, built on top of large data-sets and data streams, are utilized more frequently to handle the proliferation of internet usage, mobile devices, connected cars, and associated data streams. These machine learning applications can be created for ad targeting, content recommendation, fraud detection, and image feature extraction.

Typically, large real-time data analytics and machine learning applications are built with lambda architecture. Lambda Architecture combines batch and stream processing in order to balance the need for low latency, high throughput, and superior fault tolerance. A lambda architecture system includes three major data processing layers (i.e. a batch layer, a speed layer, and a serving layer).

In typical Lambda Architecture deployment, a batch layer, comprising a model trainer, contains large training data-sets grouped in various batches and builds one or more large scale machine learning models using the training data. A speed layer, comprising a model updater, updates or revises a machine learning model based on the most recent data points of a data stream. These trained and revised machine learning models are stored in a persistent storage system, such as a model store. Typically, a machine learning model can be stored and served in a hierarchical structured format with associated meta-data. The machine learning models can be saved in a serialized binary format or in a standard portable structured format. A serving layer, comprising a cluster of serving nodes, can serve real time prediction requests with the latest machine learning model.

One or more serving nodes of the serving node cluster can load these machine learning models and serve the on-demand prediction requests from one or more client devices. The serving nodes can reload the machine learning models when the model updater revises the machine learning model from the latest training data.

As business enterprises move Information Technology infrastructures and services to the cloud, Container as a Service (CaaS) has recently been adopted to manage the software life-cycle in the cloud. This life-cycle can include resource management, provisioning, scheduling, orchestrating, and scaling, allowing micro-services and machine learning applications to be built and deployed in the cloud.

To improve the accuracy and quality of machine learning models in production, an ever increasing amount of data is collected for training, and in turn, causing an increase in the size and complexity of machine learning models. It is now common to have a Random Forest with hundreds of trees or a Neural Network Model with millions of weight parameters. Consequently, with this increase in size and complexity, storing, deploying, and provisioning machine learning models becomes more difficult and challenging.

SUMMARY

In some exemplary embodiments, a continuous provisioning method, executed by one or more computer nodes to provide a future prediction in response to a request from one or more client devices, the continuous provisioning method includes: generating, by the one or more computer nodes, a machine learning model; determining, by the one or more computer nodes, whether the machine learning model is a new model; in response to determining the machine learning model is not the new model, retrieving, by the one or more computer nodes, one or more model containers with an associated model to a new persistent model; and determining, by the one or more computer nodes, a difference between the associated model and the new persistent model.

In other exemplary embodiments, a continuous provisioning apparatus includes: a memory and at least one processor configured to execute: a model generator configured to generate a machine learning model; and a model container builder configured to: determine whether the machine learning model is a new model, in response to determining the machine learning model is not the new model, retrieve one or more model containers with an associated model to a new persistent model, and determine a difference between the associated model and the new persistent model.

In yet other exemplary embodiments, a non-transitory computer readable recording medium including a program to execute a continuous provisioning method to provide a future prediction in response to a request from one or more client devices, the method including: generating, by one or more computer nodes, a machine learning model; determining, by the one or more computer nodes, whether the machine learning model is a new model; in response to determining the machine learning model is not the new model, retrieving, by the one or more computer nodes, one or more model containers with an associated model to a new persistent model; and determining, by the one or more computer nodes, a difference between the associated model and the new persistent model.

DETAILED DESCRIPTION

Exemplary embodiments of the present disclosure relate generally to machine learning applications, and more particularly, to continuously provisioning large-scale machine learning models. Exemplary embodiments recognize that the growing size and complexity of machine learning models increases the difficulty in storing, deploying and provisioning machine learning models. Exemplary embodiments for continuously provisioning large-scale machine learning models through composed model containers are described below with references to FIGS. 1-3.

Implementation of such exemplary embodiments may take a variety of forms, and exemplary implementation details are discussed subsequently with reference to the Figures.

Figure 1:
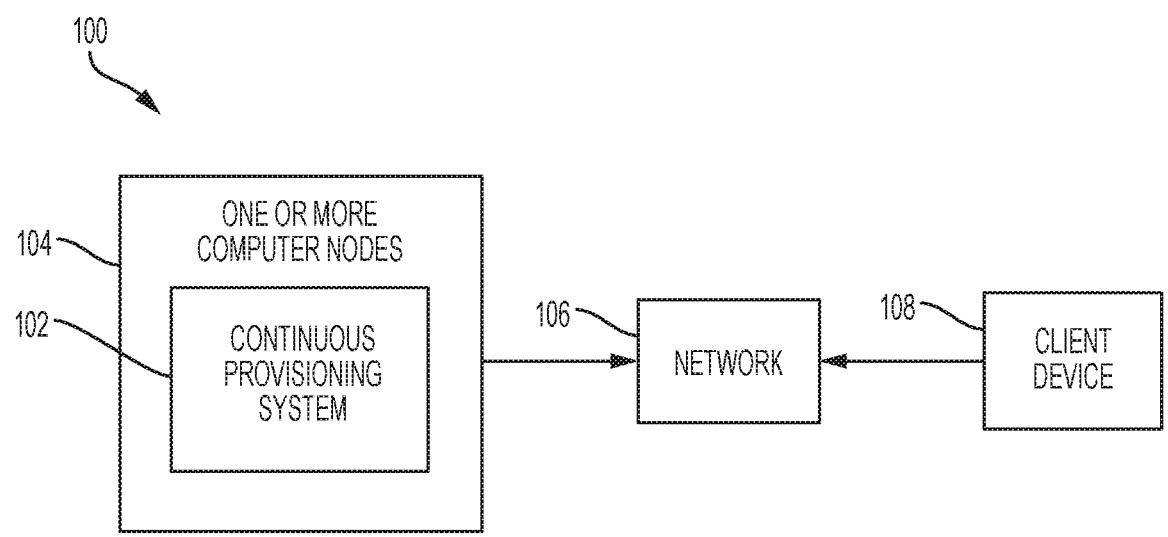
FIG. 1 is a functional block diagram illustrating a data processing environment, according to an exemplary embodiment.

FIG. 1 is a functional block diagram illustrating a data processing environment 100, according to an exemplary embodiment. FIG. 1 provides only an illustration of one implementation and does not imply any limitations with regard to a data processing environment in which different exemplary embodiments may be implemented. Many modifications of the data processing environment 100 may be made by those skilled in the art without departing from the scope of the invention as recited by the claims. In some exemplary embodiments, the data processing environment 100 includes a network 106, one or more computer nodes 104, which operates continuous provisioning system 102, and a client device 108.

Network 106 interconnects one or more computer nodes 104 and client device 108. In general, network 106 can be any combination of connections and protocols capable of supporting communications between the one or more computer nodes 104 and client device 108, and the one or more computer nodes 104 and continuous provisioning system 102. Network 106 can include wire cables, wireless communication links, fiber optic cables, routers, switches, firewalls, or any combination that can include wired, wireless, or fiber optic connections known by one of ordinary skill in the art. In some exemplary embodiments, network 106 can be a message bus. In an exemplary embodiment, continuous provisioning system 102 implements network 106 using a cluster of the one or more computer nodes 104 that can scale to handle larger message rates.

The one or more computer nodes 104 hosts continuous provisioning system 102, in accordance with the exemplary embodiments of the present disclosure. A computer node can be any programmable electronic device or computing system capable of receiving and sending data, via network 106, and performing computer-readable program instructions known by one of ordinary skill in the art. For example, a computer node can be a desktop computer, a laptop computer, or any other electronic device or computing system, known by one of ordinary skill in the art, capable of communicating with other computer nodes in a cluster through the network 106. In some exemplary embodiments, the one or more computer nodes 104 can function as one or more clusters in a distributed system, operating continuous provisioning system 102, via network 106. In an exemplary embodiment, the one or more computer nodes 104 include databases (not shown) that provide a prediction service to one or more client devices, such as client device 108. In an exemplary embodiment, the one or more computer nodes 104 can include one or more serving nodes in a serving node cluster 214 (FIG. 2) to serve a request for a prediction or a response from the client device 108. The one or more computer nodes 104 may have a provisioning system, which is either located locally or remotely from the one or more computer nodes 104, to pull a machine learning model to serve the request for a prediction or response.

In some exemplary embodiments, the one or more computer nodes 104 can include a data storage repository (not shown) for storing data including, but not limited to, machine learning applications, machine learning models, data points from user activity, training data-sets, one or more model containers, and container images. Data storage repository can be any programmable electronic device or computing system capable of receiving, storing, and sending files and data, and performing computer readable program instructions capable of communicating with the one or more computer nodes 104 and client device 108, via network 106, or with the one or more computer nodes 104 and components of continuous provisioning system 102, via network 106.

In some exemplary embodiments, components of the continuous provisioning system 102 resides locally on the one or more computer nodes 104 of distributed clusters in a data center or cloud (not shown). In an exemplary embodiment, the components of the continuous provisioning system 102, either individually or in various combinations, reside remotely from each other on the one or more computer nodes 104 of the distributed clusters, and are connected via network 106. In an exemplary embodiment, network 106 connects the one or more computer nodes 104 of the distributed clusters. (Not shown). In yet other exemplary embodiments, the components of the continuous provisioning system 102 reside on a central server (not shown).

In some exemplary embodiments, the continuous provisioning system 102 utilizes components that provide enhanced Lambda Architecture in order to select and provide an optimized prediction or response to client device 108. For example, continuous provisioning system 102, utilizing model trainer 204, generates a machine learning model and saves the generated machine learning model to the model store 206. Continuous provisioning system 102, utilizing a model container builder 208, determines whether the machine learning model is a new model (i.e., the model is generated for the first time) or an update or revision to an existing machine learning model.

In an example in which the continuous provisioning system 102 determines the machine learning model is an update or revision to an existing machine learning model, the continuous provisioning system 102 retrieves one or more model containers with an associated model to the new persistent model, determines the difference between the associated model and the new persistent model, and generates one or more model containers.

In another example in which the continuous provisioning system 102 determines the machine learning model is a new machine learning model, the continuous provisioning system 102, utilizing the model container builder 208, generates one or more model containers.

The continuous provisioning system 102, utilizing the model container builder 208, publishes the generated model containers to the global container registry 210. In response to publishing the model containers, the continuous provisioning system 102, utilizing the model container provisioning tool 212 deploys the model container to one or more serving nodes of the serving node cluster 214.

In other exemplary embodiments, continuous provisioning system 102 operates on a central server (not shown), which is connected to client device 108, via the network 106. In another exemplary embodiment, continuous provisioning system 102 may be a software-based program, downloaded from a central server and installed on one or more computer nodes 104. In yet another exemplary embodiment, continuous provisioning system 102 can be utilized as a software service provided by a third-party cloud service provider (not shown).

In some exemplary embodiments, client device 108 can be, for example, a desktop computer, a laptop computer, a smart phone, or any other electronic device or computing system, known by one of ordinary skill in the art, capable of communicating with the one or more serving nodes 214 through the network 106. For example, client device 108 may be a laptop computer capable of connecting to a network, such as network 106, to request a prediction or response from a prediction service provided by the one or more computer nodes 104. In other exemplary embodiments, client device 108 can be any suitable types of mobile devices capable of running mobile applications or a mobile operating system.

The one or more computer nodes 104 can provide a prediction service that can be accessed by client device 108. A prediction service can be embedded into any kind of online service known by one of ordinary skill in the art. For example, a client device 108 may interact with a video streaming service, by requesting a prediction or a response. In another exemplary embodiment, client device 108 may provide the state of the environment (e.g., the items searched by the user, the item(s) selected by the user, or whether the user scrolls to the next page) in the request.

Figure 2:
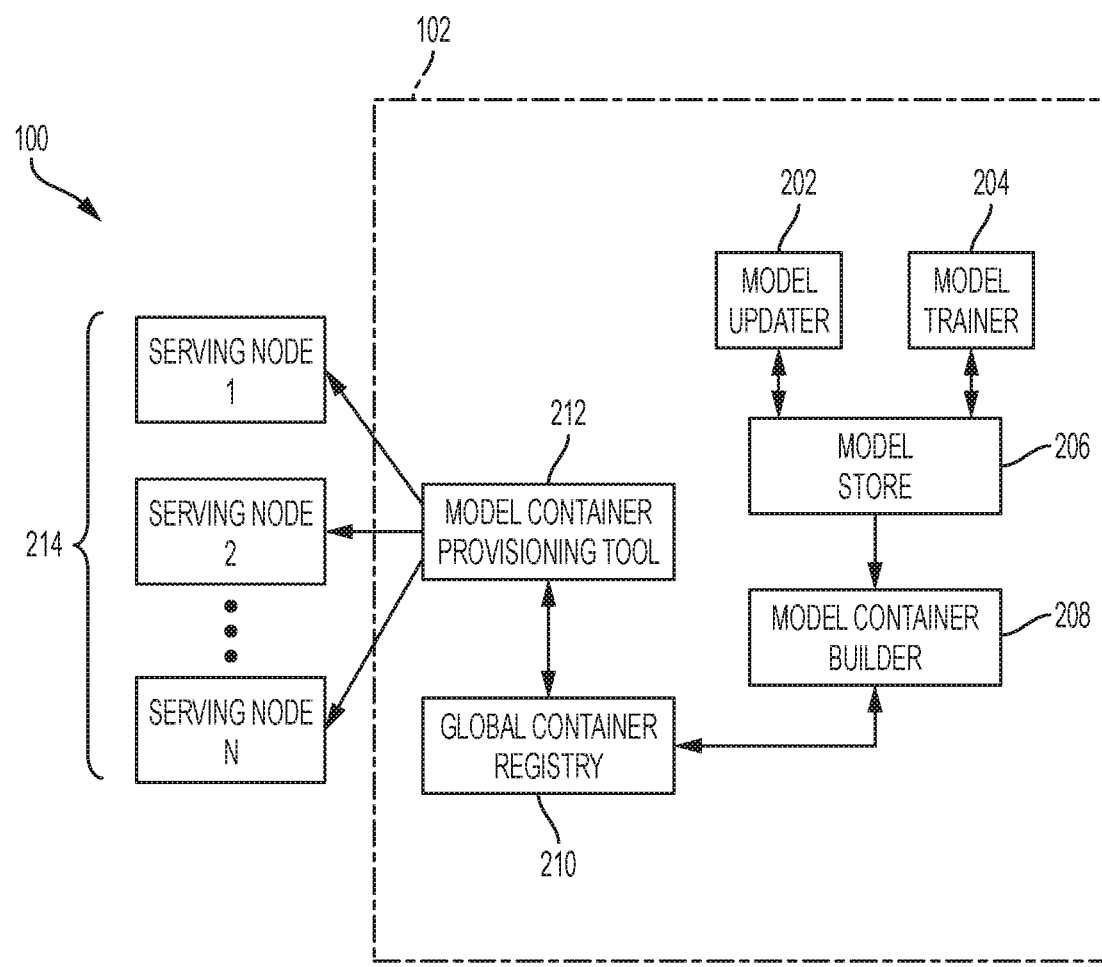
FIG. 2 is a functional block diagram illustrating components of a continuous provisioning system, according to an exemplary embodiment.

FIG. 2 is a functional block diagram illustrating components of continuous provisioning system 102, according to an exemplary embodiment. The network 106 and client device 108 are not shown in FIG. 2. The components of continuous provisioning system 102 include a model updater 202, a model trainer 204, a model store 206, a model container builder 208, a global container registry 210, and a model container provisioning tool 212.

In an exemplary embodiment, the components of continuous provisioning system 102 are integrated into enhanced Lambda Architecture for machine learning application production environments. The components of continuous provisioning system 102 may be tightly integrated into the Lambda Architecture (e.g., the continuous provisioning system 102 having a library embedded into the Lambda Architecture). The components of continuous provisioning system 102 may also be loosely integrated into the Lambda Architecture (e.g., the continuous provisioning system 102 running in parallel with the Lambda Architecture).

In some exemplary embodiments, a model trainer 204 retrieves training data-sets grouped in various batches. Model trainer 204 may be executed at any time. In an exemplary embodiment, model trainer 204 retrieves the data-sets from a data lake (not shown). A global data stream (not shown) or global messaging bus (not shown) can record a user's activity (e.g., the items searched by the user, the item(s) selected by the user, or whether the user scrolls to the next page) and push this activity into the data lake. Model trainer 204 trains one or more machine learning models using the training data. In an exemplary embodiment, model trainer 204 saves the machine learning model to the model store 206. In an exemplary embodiment, a global messaging bus can be used for the cases in which a user interacts with a messaging application by sending request message(s) and optionally receiving response message(s). These user interactions may come via open or proprietary messaging protocol(s) including short message service (SMS), session initiation protocol (SIP) and Web Real-Time Communication (WebRTC) and are recorded and pushed into data lake.

In an exemplary embodiment, model updater 202 retrieves the most recent data points from the global data stream. The model updater 202 updates or revises one or more machine learning models relevant to the most recent retrieved data points. The model updater 202 stores the updated or revised model in the model store 206. Model updater 202 notifies one or more serving nodes in a serving node cluster 214 that a new model or version is available (not shown). In some exemplary embodiments, the model updater 202 automatically pushes the new model or version to one or more serving nodes in serving node cluster 214. In other exemplary embodiments, the model updater 202 pushes the new model or version to one or more serving nodes in serving node cluster 214 in a determined time interval (e.g., a nightly model update or a weekly model update).

In an exemplary embodiment, model store 206 can be a persistent model store. The model store 206 includes the features of the data storage repository described above. In some exemplary embodiments, the model trainer 204 and the model updater 202 can each store models in a hierarchical structured format with associated meta-data. The model trainer 204 and the model updater 202 can also store the models in a serialized binary format or in a standard portable structured format.

In some exemplary embodiments, the model container builder 208 generates one or more model containers for provisioning. In an exemplary embodiment, the model container builder 208 builds model containers based on instructions in a model container build file (not shown). The model container builder 208 stores one or more built models as a group of composed model containers in one or more global container registries, such as the global container registry 210. When model trainer 204 or model updater 202 generate a new version of an existing machine learning model, such as a new version of Neural Network Model with an additional layer or a new version of Random Forest with more split trees, only small portions of the existing machine learning model change. Thus, model container builder 208 updates and provisions the relevant model containers, saving times and resources during continuously provisioning, for instance, large-scale machine learning models with numerous model containers.

In some exemplary embodiments, model container builder 208 distinguishes between a small machine learning model and a large-scale machine learning model based on a size and/or structure of the machine learning model. For example, model container builder 208 determines a neural network with five to seven layers as a small machine learning model, and determines a neural network with one hundred or more layers as a large-scale machine learning model. In another example, model container builder 208 determines a machine learning model with a megabyte of data as a small machine learning model, and determines a machine learning model with a gigabyte of data as a large-scale machine learning model.

In some exemplary embodiments, model container builder 208 packages a small machine learning model in a single model container. Model container provisioning tool 212 distributes the small machine learning model to the one or more serving nodes in the serving node cluster 214. Model container provisioning tool 212 provisions the single model container through the container distribution infrastructure. In other exemplary embodiments, model container builder 208 partitions large-scale machine learning models. Model container builder 208 stores the partitioned large-scale machine learning models in composed model containers. The model containers stores a structure of the machine learning model(s) and the logical machine learning model component(s).

In an exemplary embodiment, the model container provisioning tool 212 provisions one or more model containers to one or more serving nodes in the serving node cluster 214 in parallel. The model container provisioning tool 212 provisions one or more model containers simultaneously. In an exemplary embodiment, each serving node of the serving node cluster 214 contains a local container registry (not shown). The model container provisioning tool 212 provisions the one or more model containers to the local container registry of the one or more serving nodes. In an exemplary embodiment, a local container registry includes a registry server, notification system, and a container image repository with version control.

In some exemplary embodiments, the global container registry 210 organizes and manage the container images through a global container image catalog. The global container registry 210 provides version control management for container images. In an exemplary embodiment, model container builder 208 saves the container images in a unified version-aware format utilizing the copy-on-write snapshot file system. The version-aware file format can support the difference between model versions. The model container builder 208 builds the updated model containers by patching changes on top of the existing model containers. In an exemplary embodiment, for the cases where the provisioning tool 212 already deployed the existing model containers to the one or more serving nodes, the model container provisioning tool 212 provisions this difference between the existing associated model and the updated model to the deployed model containers. In an exemplary embodiment, large-scale machine learning models in composed model containers can be provisioned to the model serving nodes in parallel by distributing different model containers to different serving nodes simultaneously. In an exemplary embodiment, each logical part of the machine learning model can be loaded by one particular serving node, in which several serving nodes with different logical parts can construct a larger logical machine learning model.

In an exemplary embodiment, the one or more serving nodes of the serving node cluster 214 can be any programmable electronic device or computing system capable of receiving, storing, sending files and data, and performing computer readable program instructions. In an exemplary embodiment, the one or more serving nodes of the serving node cluster 214 provides a prediction or a response in response to a request from the client device 108, via network 106.

Figure 3:
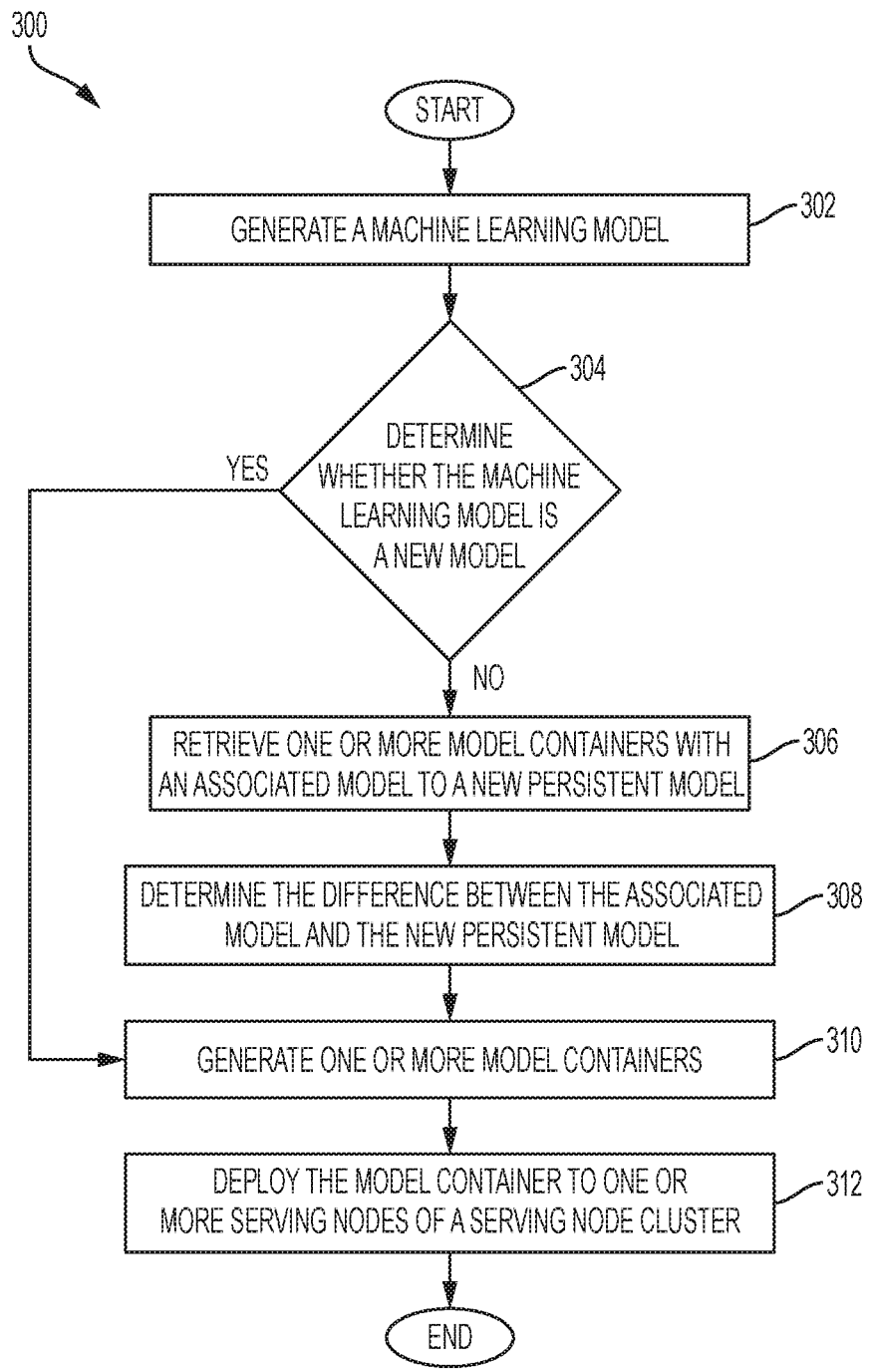
FIG. 3 is a flowchart illustrating operational steps of a continuous provisioning system (such as the continuous provisioning system of FIG. 1), according to an exemplary embodiment.

FIG. 3 is a flowchart illustrating operational steps of continuous provisioning system 102, generally designated 300, according to an exemplary embodiment. Continuous provisioning system 102 implements operational steps utilizing the components of continuous provisioning system 102, discussed above.

Model trainer 204 generates a machine learning model (302). In some exemplary embodiments, the model trainer 204 generates a machine learning model by training the machine learning model based on the latest training data. The model trainer 204 saves the machine learning model to the model store 206. In other exemplary embodiments, the model updater 202 generates a machine learning model by retrieving the most recent data points from the global data stream and updating or revising one or more machine learning models relevant to the data points. The model updater 202 saves the updated or revised machine learning models to the model store 206. In some exemplary embodiments, the model trainer 204 and model updater 202 continuously determine whether there are changes to the relevant data points to train or update a machine learning model.

Model container builder 208 determines whether the machine learning model is a new model (Decision Block 304). In an exemplary embodiment, model container builder 208 builds model containers following instructions in a model container build file (not shown), such as a model container blueprint.

If model container builder 208 determines the machine learning model is a new model (decision block 304, "YES" branch), the model container builder 208 generates one or more model containers (310). For the cases in which the machine learning model is new, the model container builder 208 determines the new machine learning model can be partitioned and transformed into a set of composed model containers.

If model container builder 208 determines the machine learning model is not new (decision block 304, "NO" branch), the model container builder 208 retrieves one or more model containers with an associated model to the new persistent model (306). The new persistent model can be an updated or revised version of an existing machine learning model. The model container builder 208 retrieves the associated model container from the global container registry 210.

The model container builder 208 determines the difference between the associated model and the new persistent model (308). In an exemplary embodiment, the model container builder 208 can build or patch the determined difference on top of the associated model.

The model container builder 208 generates one or more model containers (310). In an exemplary embodiment, the model container builder 208 generates one or more model containers by partitioning and transforming the persistent model into a group of composed model containers. For the cases in which the model container builder 208 determines the machine learning model is a new model, the model container builder 208 partitions and transforms the new machine learning model into the group of composed model containers.

Partitioning and transforming the persistent model can occur at both the whole model level and the model component level. In an example using a Random Forest, an existing random forest model can have 5 trees. When a new version is built, the random forest model may become 6 trees. Therefore, a new tree is created, and a new container can be created for the new tree. For the other existing 5 trees, some branches in these trees are changed, and the difference needs to be computed. Therefore, a new version of model containers associated with existing trees will be created by patching existing containers.

Since machine learning models have different model structures and methods to compute prediction, an individual machine learning model can have its own partition and transformation instructions. For example, a model container blueprint for a Random Forest can provide instructions to build a model container for each tree, and at production, each model container can be mounted to a dedicated model serving container for parallel execution.

Model container builder 208 publishes the generated model containers to the global container registry 210. In an exemplary embodiment, model container builder 208 includes a local container registry to store the container images of the built container model. In an exemplary embodiment, the model container blueprint provides commands and instructions for the model container builder 208, via the local container registry, to push the generated model container images to the global container registry with hierarchical naming, versioning, and optional tags.

In response to publishing the model containers to the global container registry 210, the model container provisioning tool 212 deploys the model containers to one or more serving nodes of the serving node cluster 214. In an exemplary embodiment, an administrator (not shown) at a serving node can issue a command to the model container provisioning tool 212 to deploy and provision the latest model. The model container provisioning tool 212 commands the serving node to pull the latest model container images from the local container registry. For the cases in which the latest model container is not on the local container registry, the local container registry determines if the latest model container is available in the global container registry 210. When the local container registry determines the latest model container is available, the local container registry pulls the latest model container from the global container registry 210 to the local container registry. In an exemplary embodiment, the serving node can retrieve the latest model containers from the local container registry. A local container registry can reside locally on each serving node of the serving node cluster 214.

In some exemplary embodiments, for the cases in which the machine learning application is considered Non-Mission-Critical, the model container provisioning tool 212 restarts the model serving containers on a rolling basis. The latest model containers connect or bind the restarted model serving containers for future prediction requests.

In some exemplary embodiments, for the cases in which the machine learning application is considered a Mission-Critical 24×7 machine learning application, the model container provisioning tool 212 notifies the running model serving containers to dynamically bind the new model containers and unbind the old model containers, in which the future prediction requests will be served with the latest model containers.

Although the subject matter has been described in terms of exemplary embodiments, it is not limited thereto. Rather, the appended claims should be construed broadly, to include other variants and exemplary embodiments, which may be made by those skilled in the art without departing from the scope and range of equivalents of the subject matter.

What is claimed is:

1. A continuous provisioning method, executed by one or more computer nodes to provide a future prediction in response to a request from one or more client devices, the continuous provisioning method comprising:
generating, by the one or more computer nodes, a first machine learning model, wherein the first machine learning model is represented by at least a first model container;
determining, by the one or more computer nodes, that the first machine learning model is not a new model;
in response to determining that the first machine learning model is not the new model, retrieving, by a first node of the one or more computer nodes, a second model container associated with a second machine learning model, wherein the first machine learning model is a revised version of the second machine learning model; and
expressing a new persistent model, wherein the expressing comprises determining, by the one or more computer nodes, a difference between the second model container and the first model container.

2. The continuous provisioning method of claim 1, wherein the generating the first machine learning model comprises:
training the first machine learning model based on training data, or
retrieving data points from a global data stream and updating the first machine learning model based on the retrieved data points.

3. The continuous provisioning method of claim 1, further comprising determining a patch of the second model container to enable representation of the first model container.

4. The continuous provisioning method of claim 1, further comprising generating, by the one or more computer nodes, one or more model containers by partitioning and transforming the new persistent model into the one or more model containers, wherein the one or more model containers comprises the first model container.

5. The continuous provisioning method of claim 4, further comprising:
publishing, by the one or more computer nodes, the one or more model containers to a global container registry; and
in response to the publishing the one or more model containers, deploying, by the one or more computer nodes, the one or more model containers to one or more serving nodes.

6. The continuous provisioning method of claim 5, further comprising, in response to determining at least one image of the one or more model containers is not on a local container registry, retrieving, by the one or more computer nodes, the at least one image of the one or more model containers from the global container registry.

7. A continuous provisioning apparatus comprising:
a memory and at least one processor configured to execute:
a model generator configured to generate a first machine learning model, wherein the first machine learning model is represented by at least a first model container; and
a model container builder configured to:
determine that the first machine learning model is not a new model,
in response to determining that the first machine learning model is not the new model, retrieve a second model container associated with a second machine learning model, wherein the first machine learning model is a revised version of the second machine learning model, and
express a new persistent model at least in part by determining a difference between the second model container and the first model container.

8. The continuous provisioning apparatus of claim 7, wherein the model generator comprises a model trainer configured to train the first machine learning model based on training data, or a model updater configured to retrieve data points from a global data stream and update the first machine learning model based on the retrieved data points.

9. The continuous provisioning apparatus of claim 7, wherein the model container builder is further configured to determine a patch of the second model container to enable representation of the first model container.

10. The continuous provisioning apparatus of claim 7, wherein the model container builder is further configured to generate one or more model containers by partitioning and transforming the new persistent model into the one or more model containers, wherein the one or more model containers comprises the first model container.

11. The continuous provisioning apparatus of claim 10, wherein the model container builder is further configured to publish the one or more model containers to a global container registry, and a model container provisioner configured to, in response to the model container builder publishing the one or more model containers, deploy the one or more model containers to one or more serving nodes.

12. The continuous provisioning apparatus of claim 11, wherein the model container provisioner is configured to, in response to determining at least one image of the one or more model containers is not on a local container registry, retrieve the at least one image of the one or more model containers from the global container registry.

13. A non-transitory computer readable recording medium comprising a program to execute a continuous provisioning method to provide a future prediction in response to a request from one or more client devices, the method comprising:

generating, by one or more computer nodes, a first machine learning model, wherein the first machine learning model is represented by at least a first model container;

determining, by the one or more computer nodes, that the first machine learning model is not a new model;

in response to determining that the first machine learning model is not the new model, retrieving, by a first node of the one or more computer nodes, a second model container associated with a second machine learning model, wherein the first machine learning model is a revised version of the second machine learning model; and expressing a new persistent model, wherein the expressing comprises determining, by the one or more computer nodes, a difference between the second model container and the first model container.

* * * * *